(12) United States Patent
Zebian et al.

(10) Patent No.: US 9,861,011 B1
(45) Date of Patent: Jan. 2, 2018

(54) STACKABLE SLEDS FOR STORING ELECTRONIC DEVICES

(71) Applicant: HGST Netherlands B.V., Amsterdam (NL)

(72) Inventors: Hussam Zebian, San Jose, CA (US); Thomas Albrecht, San Jose, CA (US)

(73) Assignees: HGST NETHERLANDS B.V., Amsterdam (NL); WESTERN DIGITAL TECHNOLOGIES, INC., Irvine, CA (US)

( * ) Notice: Subject to any disclaimer, the term of this patent is extended or adjusted under 35 U.S.C. 154(b) by 6 days.

(21) Appl. No.: 15/189,921

(22) Filed: Jun. 22, 2016

(51) Int. Cl.
| | |
|---|---|
| H05K 7/20 | (2006.01) |
| H05K 7/14 | (2006.01) |
| G06F 1/20 | (2006.01) |
| H05K 5/03 | (2006.01) |

(52) U.S. Cl.
CPC ........... *H05K 7/20736* (2013.01); *G06F 1/20* (2013.01); *H05K 5/03* (2013.01); *H05K 7/1488* (2013.01)

(58) Field of Classification Search
None
See application file for complete search history.

(56) References Cited

U.S. PATENT DOCUMENTS

| | | | |
|---|---|---|---|
| 4,454,566 A * | 6/1984 | Coyne | ................ H05K 7/20545 361/721 |
| 4,501,460 A | 2/1985 | Sisler | |
| 5,269,698 A | 12/1993 | Singer | |
| 5,277,615 A | 1/1994 | Hastings et al. | |
| 5,325,263 A | 6/1994 | Singer et al. | |
| 5,619,398 A | 4/1997 | Harrison et al. | |
| 5,764,481 A | 6/1998 | Ruch et al. | |
| 5,818,691 A | 10/1998 | McMahan et al. | |
| 5,928,016 A | 7/1999 | Anderson et al. | |
| 6,008,984 A | 12/1999 | Cunningham et al. | |
| 6,111,754 A | 8/2000 | Abbott et al. | |
| 6,115,245 A | 9/2000 | Ruch et al. | |

(Continued)

FOREIGN PATENT DOCUMENTS

| | | |
|---|---|---|
| CN | 104391551 | 3/2015 |
| EP | 2309611 | 4/2011 |

OTHER PUBLICATIONS

Notice of Allowance for U.S. Appl. No. 15/132,651 dated Apr. 24, 2017.

(Continued)

*Primary Examiner* — Xanthia C Cunningham
(74) *Attorney, Agent, or Firm* — Kunzler, PC (57) ABSTRACT

Described herein is a first system that includes sleds each having sidewalls, a mounting plate, and a first cover. The first cover is movable relative to the sidewalls between a closed position and an open position. The first cover includes at least one first opening. The system additionally includes at least one data storage device fixed to each mounting plate. A first air gap is defined between the at least one data storage device and the mounting plate, and a second air gap is defined between the at least one data storage device and the at least one first opening of the first cover. The sleds are stacked together such that the first covers of adjacent sleds are directly adjacent each other, and the at least one first opening of the first cover of one sled at least partially overlaps the at least one first opening of an adjacent sled.

20 Claims, 6 Drawing Sheets

(56) References Cited

U.S. PATENT DOCUMENTS

| | | | |
|---|---|---|---|
| 6,157,538 A * | 12/2000 | Ali | G06F 1/20 |
| | | | 165/185 |
| 6,227,632 B1 | 5/2001 | Liu | |
| 6,288,902 B1 | 9/2001 | Kim et al. | |
| 6,373,696 B1 * | 4/2002 | Bolognia | G06F 1/184 |
| | | | 361/679.33 |
| 6,424,523 B1 | 7/2002 | Curtis et al. | |
| 6,621,693 B1 * | 9/2003 | Potter | G06F 1/184 |
| | | | 257/E23.099 |
| 7,061,715 B2 | 6/2006 | Miyamoto et al. | |
| 7,102,886 B2 | 9/2006 | Peng et al. | |
| 7,108,524 B2 | 9/2006 | Wahler | |
| 7,375,923 B2 * | 5/2008 | DeCenzo | G11B 33/128 |
| | | | 360/73.01 |
| 7,457,112 B2 | 11/2008 | Fukuda et al. | |
| 7,542,295 B2 | 6/2009 | Imsand | |
| 7,857,688 B1 * | 12/2010 | Cunningham | H05K 7/20736 |
| | | | 361/679.01 |
| 7,911,788 B2 | 3/2011 | Sasagawa et al. | |
| 7,984,258 B2 * | 7/2011 | Sicola | G06F 3/0605 |
| | | | 711/112 |
| 8,009,425 B2 | 8/2011 | Kang | |
| 8,305,751 B2 | 11/2012 | Merrow | |
| 8,369,087 B2 | 2/2013 | Wu et al. | |
| 8,427,835 B2 * | 4/2013 | Xu | G06F 1/187 |
| | | | 174/69 |
| 8,677,381 B2 | 3/2014 | Kawakami | |
| 8,737,078 B2 | 5/2014 | Zhang et al. | |
| 8,953,281 B1 * | 2/2015 | Lee | G06F 1/187 |
| | | | 360/99.15 |
| 9,268,357 B2 | 2/2016 | Kyle et al. | |
| 9,612,629 B2 | 4/2017 | Hirano et al. | |
| 2002/0020682 A1 * | 2/2002 | Broome | H05K 7/186 |
| | | | 211/26 |
| 2004/0145869 A1 * | 7/2004 | Tanaka | G11B 33/125 |
| | | | 361/695 |
| 2006/0227505 A1 | 10/2006 | Miyamoto et al. | |
| 2010/0002366 A1 | 1/2010 | Pav | |
| 2011/0234064 A1 | 9/2011 | Makley et al. | |
| 2012/0069514 A1 * | 3/2012 | Ross | H05K 7/20727 |
| | | | 361/679.33 |
| 2012/0243170 A1 | 9/2012 | Frink et al. | |
| 2013/0148287 A1 | 6/2013 | Chang | |
| 2014/0055944 A1 * | 2/2014 | McCabe | G06F 1/187 |
| | | | 361/679.39 |
| 2014/0251678 A1 * | 9/2014 | Chen | H05K 5/0221 |
| | | | 174/520 |
| 2014/0340837 A1 | 11/2014 | Jau et al. | |
| 2015/0016059 A1 * | 1/2015 | Esmaily | H05K 7/20145 |
| | | | 361/695 |
| 2015/0181748 A1 * | 6/2015 | Bailey | H05K 7/1488 |
| | | | 361/679.58 |
| 2015/0271944 A1 * | 9/2015 | Ross | G06F 1/187 |
| | | | 361/679.33 |
| 2015/0359115 A1 | 12/2015 | Hirano et al. | |
| 2016/0050795 A1 | 2/2016 | Conn et al. | |
| 2016/0057883 A1 * | 2/2016 | Zebian | G11B 33/128 |
| | | | 702/186 |
| 2016/0066468 A1 | 3/2016 | Smith et al. | |
| 2016/0070295 A1 * | 3/2016 | Brause | G11B 33/128 |
| | | | 361/679.33 |
| 2016/0128223 A1 * | 5/2016 | Fu | H05K 7/1489 |
| | | | 361/679.31 |
| 2016/0128237 A1 * | 5/2016 | Szeremeta | G11B 33/128 |
| | | | 361/679.31 |
| 2016/0262270 A1 * | 9/2016 | Isaacs | H05K 1/0203 |
| 2016/0295728 A1 * | 10/2016 | Alvarado | H05K 5/03 |
| 2016/0363966 A1 * | 12/2016 | Davis | G06F 1/187 |
| 2017/0031392 A1 * | 2/2017 | Beall | G06F 1/185 |
| 2017/0034945 A1 * | 2/2017 | Pronozuk | H05K 7/1492 |
| 2017/0090528 A1 * | 3/2017 | Chen | G06F 1/187 |
| 2017/0150621 A1 * | 5/2017 | Breakstone | G06F 13/4022 |

OTHER PUBLICATIONS

International Search Report and Written Opinion for International Patent Application No. PCT/US2017/020296 dated May 30, 2017.
International Search Report and Written Opinion for International Patent Application No. PCT/US2017/020295 dated Jun. 2, 2017.
Huang et al., Thermal design of a disk-array system, Inter Society Conference on Thermal Phenomena, 2002, pp. 105-112, retrieved from http://www.researchgate.net/publication/3954229, retrieved on Nov. 4, 2015.

* cited by examiner

STACKABLE SLEDS FOR STORING ELECTRONIC DEVICES

FIELD

This disclosure relates generally to apparatuses for storing data storage devices, and more particularly to stackable sleds each storing data storage devices.

BACKGROUND

Electronic devices, such as electronic data storage devices, including hard disk drives, are commonly used for storing and retrieving digital information. Electronic devices are often mounted in a vertically or horizontally stacked array within a structure or cage. For example, a hard disk drive sled may house a plurality of individually-connected hard disk drives. Such a hard disk drive sled allows removal and replacement of an individual hard disk drive within the sled without disrupting the other hard disk drives within the sled.

In a hard disk drive sled, each hard disk drive may be connected to an electrical connector (such as a Serial Attached SCSI (Small Computer System Interface) (SAS) connector) within the sled. The electrical connector can then be operatively coupled to a printed circuit board within the sled. A hard disk drive sled promotes the protection of the electrical connector and printed circuit board, as well as the hard disk drives, during the use, removal, and replacement of the hard disk drives. In this manner, the performance and reliability of the hard disk drives can be maintained.

Heat management, including heat dissipation, for electronic data storage devices, such as hard disk drives, in a sled can be difficult. Hard disk drives generate heat during operation. To maintain the operability (e.g., avoid overheating) of the hard disk drives, at least some portion of the heat generated by the hard disk drives should be dissipated from the hard disk drives into the environment. Due to small, restricted, and often obstructed airflow passageways commonly associated with hard disk drives tightly compacted together within the confined space of a sled, dissipating heat from operating hard disk drives in a sled is challenging. For example, some sleds include solid covers (e.g., covers without openings) covering the top and bottom of the sled. Accordingly, when such sleds are stacked on top of each other, a gap is defined between the covers that air may pass through, but does not contribute to cooling the electronic data storage devices stored in the sleds.

SUMMARY

The subject matter of the present application has been developed in response to the present state of the art, and in particular, in response to the shortcomings of electronic device sleds, that have not yet been fully solved by currently available techniques. For example, because conventional sleds have two solid covers without openings, the covers occupy more space than covers with openings and occupy more space than a single, solid, and middle-mounted mounting plate. Additionally, as mentioned above, the air gap between the solid covers of adjacent conventional sleds is not used for dissipating heat from the array of electronic data storage devices stored in the sleds. Furthermore, because a boundary layer is formed at each solid surface of a component, for a given flow gap, two solid covers each with two solid surfaces results in a reduced flow compared to a single solid mounting plate with two solid surfaces. Accordingly, the subject matter of the present application has been developed to provide a stackable sled configuration (e.g., with vertically stacked sleds, horizontally stacked sleds, or stacked in another orientation) that overcomes at least some of the above-discussed shortcomings of prior art techniques by, in some embodiments, reducing obstructions to air flow, utilizing gaps between adjacent sleds for dissipating heat from electronic storage devices, and/or reducing boundary-layer inducing solid surfaces.

According to one embodiment, a first system includes sleds each having sidewalls, a mounting plate, and a first cover. The sidewalls define an interior space having a first open end. The mounting plate includes opposing first and second sides. Moreover, the mounting plate is non-movably fixed relative to the sidewalls and positioned within the interior space. The first cover is movable relative to the sidewalls between a closed position, at least partially covering the first open end, and an open position, uncovering the first open end. The first cover includes at least one first opening. The system additionally includes at least one data storage device removably fixed to the first side of each mounting plate of the sleds such that, for each sled, a first air gap is defined between the at least one data storage device and the first side of the mounting plate, and a second air gap is defined between the at least one data storage device and the at least one first opening of the first cover. The sleds are stacked together such that the first covers of adjacent sleds are directly adjacent each other, and the at least one first opening of the first cover of one sled at least partially overlaps the at least one first opening of an adjacent sled.

In some implementations of the first system, the first cover includes at least two first openings and a slat separating adjacent first openings of the at least two first openings. The slats of the first covers of adjacent sleds do not overlap each other. The first cover can include a plurality of first openings and a plurality of slats each separating adjacent first openings of the plurality of first openings of the first cover. The sleds can be stacked together such that the plurality of slats of the first cover of one sled are staggered relative to the plurality of slats of the first cover of an adjacent sled.

According to some implementations of the first system, the interior space has a second open end, defined by the sidewalls, opposing and spaced apart from the first open end. The mounting plate is positioned between the first and second open ends of the interior space. Each sled further includes a second cover movable relative to the sidewalls between a closed position, at least partially covering the second open end, and an open position, uncovering the second open end, wherein the second cover comprises at least one second opening. At least one data storage device is removably fixed to the second side of each mounting plate of the sleds such that for each sled, a third air gap is defined between the at least one data storage device and the second side of the mounting plate, and a fourth air gap is defined between the at least one data storage device and the at least one second opening of the second cover. The sleds are stacked together such that the second covers of adjacent sleds are directly adjacent each other, and the at least one second opening of the second cover of one sled at least partially overlaps the at least one second opening of an adjacent sled. The second cover can include at least two second openings and a slat separating adjacent second openings of the at least two second openings. The slats of the second covers of adjacent sleds do not overlap each other.

In certain implementations of the first system, the sleds are vertically stacked, and a plurality of data storage devices are removably fixed to the first side of each mounting plate of the sleds. The plurality of data storage devices on the first side of each mounting plate are positioned horizontally adjacent each other. The first cover may also include spaced-apart sides closed to and defining the at least one first opening, and spaced-apart ends open to the at least one first opening. For each sled, a first unobstructed air flow channel, including the second air gaps, extends between the spaced-apart ends of the first cover, inclusively. The sidewalls can include spaced-apart end walls substantially co-extensive with the spaced-apart ends of the first cover (the end walls each includes at least one third opening) and for each sled, a second unobstructed air flow channel, including the first air gaps, extends between the third openings of the ends walls, inclusively. The interior space can have a second open end, defined by the sidewalls, opposing and spaced apart from the first open end. The mounting plate can be positioned between the first and second open ends of the interior space. Each sled may further include a second cover movable relative to the sidewalls between a closed position, at least partially covering the second open end, and an open position, uncovering the second open end, wherein the second cover comprises at least one second opening. At least one data storage device can be removably fixed to the second side of each mounting plate of the sleds such that for each sled, a third air gap is defined between the at least one data storage device and the second side of the mounting plate, and a fourth air gap is defined between the at least one data storage device and the at least one second opening of the second cover. The sleds may be stacked together such that the second covers of adjacent sleds are directly adjacent each other, and each of the at least one second opening of the second cover of one sled at least partially overlaps the at least one second opening of an adjacent sled. The second cover can further include spaced-apart sides closed to and defining the at least one second opening and spaced-apart ends open to the at least one second opening. For each sled, a third unobstructed air flow channel, including the third air gaps, extends between the spaced-apart ends of the second cover, inclusively. The spaced-apart end walls of the sidewalls are substantially co-extensive with the spaced-apart ends of the second cover. For each sled, a fourth unobstructed air flow channel, including the fourth air gaps, extends between the third openings of the ends walls, inclusively.

According to some implementations of the first system, a fifth air gap is defined between the at least one data storage device of one sled and the at least one data storage device of an adjacent sled. Further, a ratio of a thickness of the fifth air gap to the thickness of the first air gap is less than about 1.5.

In certain implementations of the first system, a ratio of a total flow area of the first air gap to a total flow area of a fifth air gap can be less than about 1.2, where the fifth air gap is defined between the at least one data storage device of one sled and the at least one data storage device of an adjacent sled.

In yet some implementations of the first system, the at least one first opening is sized such that an open area percentage of the first cover is greater than about 70%. For each sled, a ratio of a total number of first openings in the first cover to a total number of data storage devices removably fixed to the first side of the mounting plate can be less than or equal to about 0.625.

According to certain implementations of the first system, the at least one first opening has a first dimension in a first direction greater than the first dimension of each of the at least one data storage device in the first direction and has a second dimension in a second direction, perpendicular to the first direction, less than the second dimension of each of the at least one data storage device in the second direction.

In another embodiment, a sled for storing a plurality of data storage devices includes sidewalls defining an interior space having a first open end and a second open end opposing the first open end. The sled also includes a mounting plate that includes opposing first and second sides, non-movably fixed relative to the sidewalls and positioned within the interior space between the first and second open ends. Additionally, the sled includes a first cover movable relative to the sidewalls between a closed position, at least partially covering the first open end, and an open position, uncovering the first open end. The first cover includes at least two first openings and a slat separating adjacent first openings of the at least two first openings. The sled further includes a second cover movable relative to the sidewalls between a closed position, at least partially covering the second open end, and an open position, uncovering the second open end. The second cover includes at least two second openings and a slat separating adjacent second openings of the at least two second openings. Each slat of the first cover is staggered relative to each slat of the second cover.

According to some implementations of the sled, the first cover and second cover are pivotally coupled to the sidewalls and pivotable relative to the sidewalls between the closed and open positions.

In yet certain implementations of the sled, the first cover includes spaced-apart sides closed to and defining the at least two first openings. The first cover also includes spaced-apart ends open to the at least two first openings. The second cover includes spaced-apart sides closed to and defining the at least two second openings. Also, the second cover includes spaced-apart ends open to the at least two second openings. The sidewalls include spaced-apart end walls substantially co-extensive with the spaced-apart ends of the first cover and the second cover. Additionally, the end walls each includes at least one second opening.

According to some implementations of the sled, the at least two first openings are sized such that an open area percentage of the first cover is greater than about 70%. Also, the at least two second openings are sized such that an open area percentage of the second cover is greater than about 70%.

In yet another embodiment, a second system includes sleds. Each sled includes sidewalls that define an interior space having a first open end and a second open end. The second open end opposes and is spaced apart from the first open end. Each sled includes a mounting plate that includes opposing first and second sides. The mounting plate is non-movably fixed relative to the sidewalls and positioned within the interior space between the first and second open ends of the interior space. Furthermore, each sled includes a first cover movable relative to the sidewalls between a closed position, at least partially covering the first open end, and an open position, uncovering the first open end. The first cover includes at least two first openings and a slat separating adjacent first openings of the at least two first openings. Each sled additionally includes a second cover movable relative to the sidewalls between a closed position, at least partially covering the second open end, and an open position, uncovering the second open end. The second cover includes at least two second openings and a slat separating adjacent second openings of the at least two second openings. The second system also includes a plurality of data storage devices removably fixed to each of the first side and second side of each mounting plate of the sleds such that, for each sled, a first air gap is defined between the at least one data storage device and the first side of the mounting plate, a second air gap is defined between the at least one data storage device and the at least two first openings of the first cover, a third air gap is defined between the at least one data storage device and the second side of the mounting plate, and a fourth air gap is defined between the at least one data storage device and the at least two second openings of the second cover. The sleds are stacked together such that the first covers of adjacent sleds are directly adjacent each other, each of the at least two first openings of the first cover of one sled at least partially overlaps the at least two first openings of an adjacent sled, the slats of the first covers of adjacent sleds do not overlap each other, the second covers of adjacent sleds are directly adjacent each other, each of the at least two second openings of the second cover of one sled at least partially overlaps the at least two second openings of an adjacent sled, and the slats of the second covers of adjacent sleds do not overlap each other.

The described features, structures, advantages, and/or characteristics of the subject matter of the present disclosure may be combined in any suitable manner in one or more embodiments and/or implementations. In the following description, numerous specific details are provided to impart a thorough understanding of embodiments of the subject matter of the present disclosure. One skilled in the relevant art will recognize that the subject matter of the present disclosure may be practiced without one or more of the specific features, details, components, materials, and/or methods of a particular embodiment or implementation. In other instances, additional features and advantages may be recognized in certain embodiments and/or implementations that may not be present in all embodiments or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific embodiments that are illustrated in the appended drawings. Understanding that these drawings depict only typical embodiments of the subject matter and are not therefore to be considered to be limiting of its scope, the subject matter will be described and explained with additional specificity and detail through the use of the drawings, in which.

DETAILED DESCRIPTION

Reference throughout this specification to "one embodiment," "an embodiment," or similar language means that a particular feature, structure, or characteristic described in connection with the embodiment is included in at least one embodiment of the present disclosure. Appearances of the phrases "in one embodiment," "in an embodiment," and similar language throughout this specification may, but do not necessarily, all refer to the same embodiment. Similarly, the use of the term "implementation" means an implementation having a particular feature, structure, or characteristic described in connection with one or more embodiments of the present disclosure, however, absent an express correlation to indicate otherwise, an implementation may be associated with one or more embodiments.

Figure 1A:
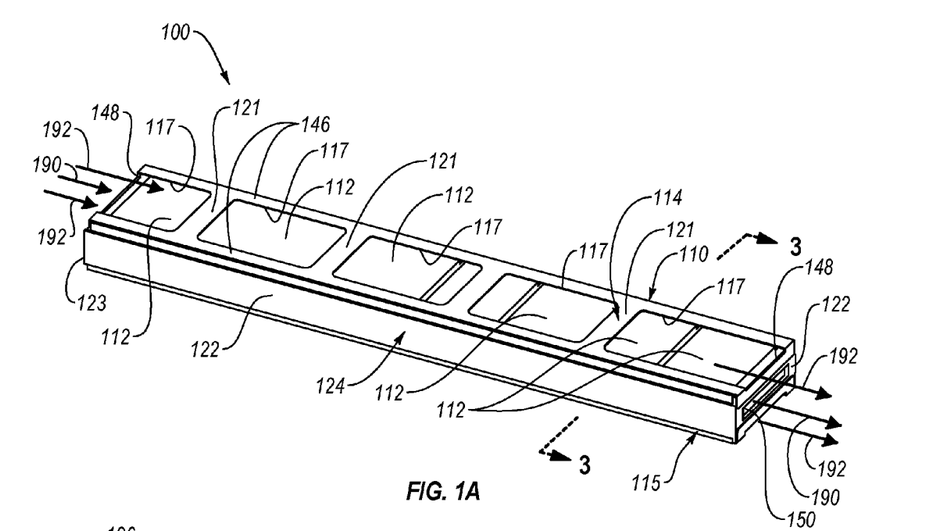
FIG. 1A is a perspective view of an array of electronic devices within a sled having a cover in a closed position, according to one or more embodiments of the present disclosure.
Figure 1B:
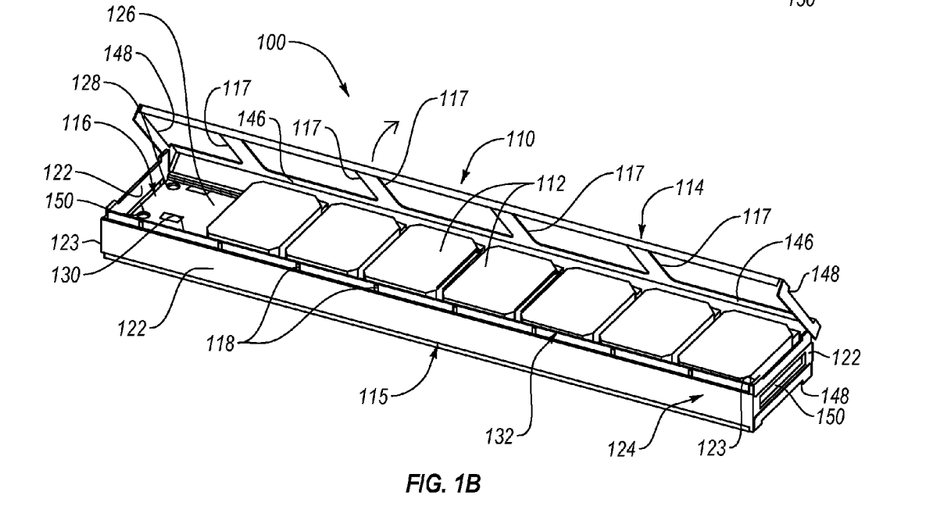
FIG. 1B is a perspective view of the sled of FIG. 1A with the cover in an open position, according to one or more embodiments of the present disclosure.
Figure 2:
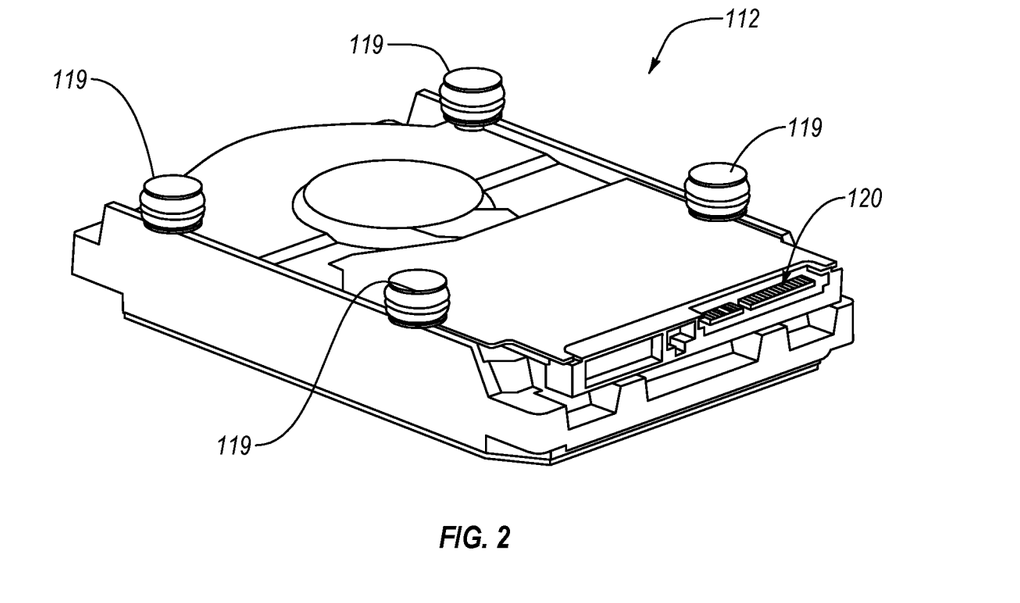
FIG. 2 is a perspective view of an electronic device, depicted as a hard disk drive, with compliant mounting feet, according to one or more embodiments of the present disclosure.

Referring to FIGS. 1A and 1B, a system 100 includes a sled 110 and an array of electronic devices 112 positioned within the sled 110. Generally, the sled 110 is configured to facilitate the storage and protection of the electronic devices 112, while allowing electronic interconnectivity with the electronic devices 112 from outside the sled 110. Because the sled 110 houses an array of electronic devices 112, the sled 110 can be considered an electronic device array sled. The electronic devices 112 can be any of various electronic devices. For example, according to some implementations, the electronic devices 112 are data storage devices, such as hard disk drives, tape drives, solid-state memory drives, and the like. In implementations where the array of electronic devices 112 is an array of hard disk drives, the sled 110 can be considered a hard disk drive array sled. The electronic device 112 includes an electronic connection 120 (as shown in FIGS. 2 and 3) with which the electronic device 112 may be electronically, and at least partially physically, coupled to the sled 110.

Figure 3:
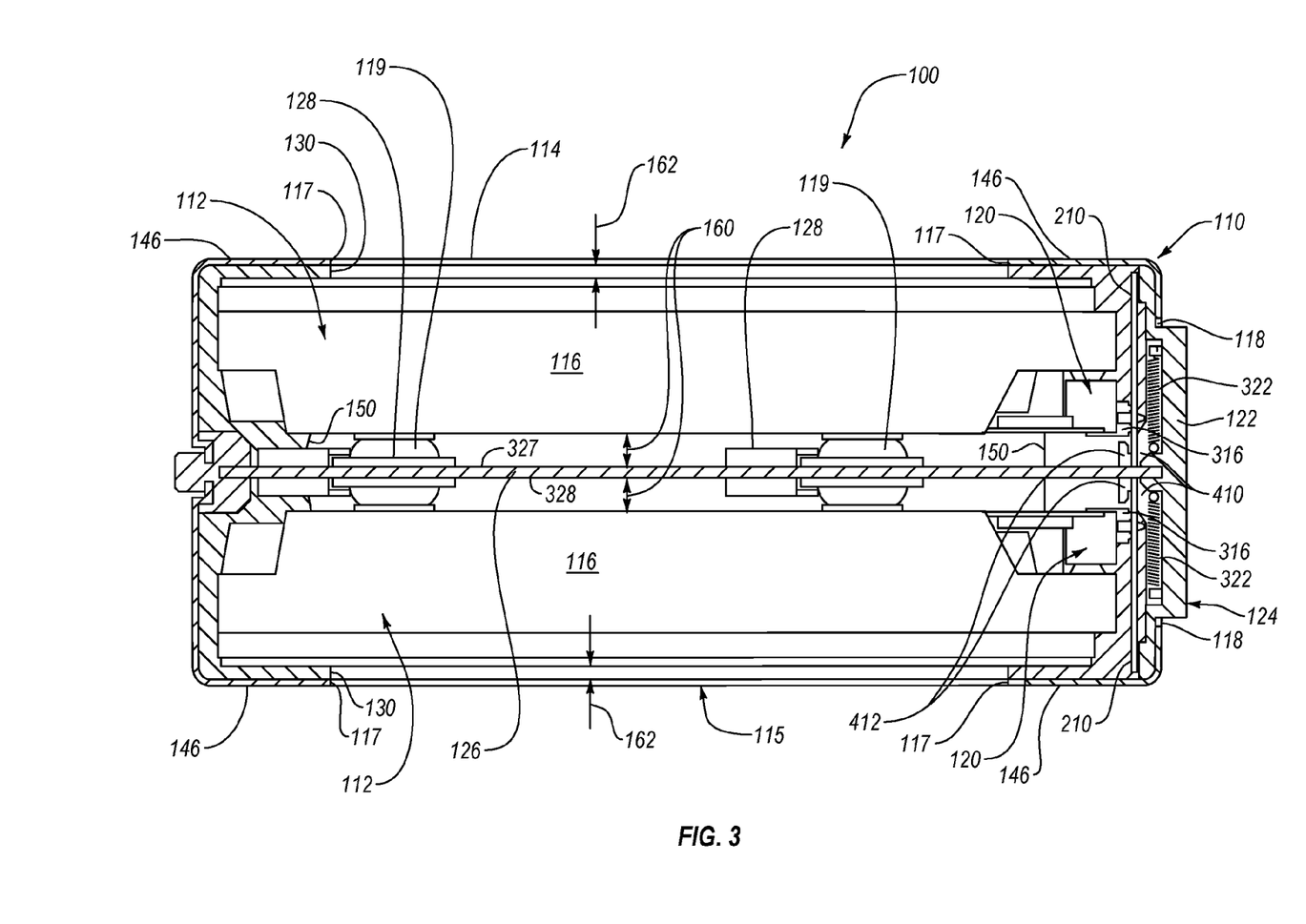
FIG. 3 is a cross-sectional side view of the sled with electronic devices of FIG. 1A taken along the line 3-3 of FIG. 1A, according to one or more embodiments of the present disclosure.

As shown in FIGS. 1A, 1B, and 3, the sled 110 includes a base 124 and at least one first cover 114 coupleable to the base 124. In the illustrated implementation, the sled 110 also includes at least one second cover 115 coupleable to the base 124 on an opposite side of the base 124 relative to the first cover 114. Generally, the electronic devices 112 are mounted to the base 124 and at least partially housed within the base 124. The base 124 includes sidewalls 122 and a mounting plate 126 fixed relative to the sidewalls 122. In the illustrated embodiment, the sidewalls 122 of the base 124 include a pair of elongate sidewalls and a pair of end walls 123 at opposing ends of the sidewalls. Each of the end walls 123 includes a circumferentially enclosed opening 150. The mounting plate 126 can be fixed directly to the sidewalls 122 via any of various fixation techniques, such as fasteners, brackets, mounts, bonding, adhesion, and the like. Moreover, the mounting plate 126 is configured to receive and at least partially support the electronic devices 112 thereon. The mounting plate 126 includes a first side 327 on which a first set of electronic devices 112 can be mounted and a second side 328 on which a second set of electronic devices 112 can be mounted.

In some implementations, each of the first and second sides 327, 328 of the mounting plate 126 includes mounting features 128 configured to engage corresponding mounting features, such as mounting feet 119, of the electronic devices 112. The mounting feet 119 are resiliently flexible, in some implementations, to facilitate the movement of the electronic devices 112 relative to the mounting plate 126. Additionally, the base 124 includes an interior cavity 116 or interior space defined between the sidewalls 122. The interior cavity 116 is accessible through opposing openings 130 defined by opposing open ends of the sidewalls 122 (see, e.g., FIG. 3). However, the interior cavity 116 of the base 124 can be divided into two portions by the mounting plate 126, with each portion of the interior cavity 116 being accessible by a respective one of the openings 130 of the base 124.

As shown in FIG. 3, electronic devices 112 can be mounted to both sides 327, 328 of the mounting plate 126 such that electronic devices 112 mounted to a top side of the mounting plate 126 are positioned within one portion of the interior cavity 116, and electronic devices 112 mounted to a bottom side of the mounting plate 126 are positioned within another portion of the interior cavity 116. In this manner, the sled 110, in the illustrated embodiments, can be considered a two-sided sled 110. The mounting feet 119 of the electronic devices 112, when engaged with the mounting features 128 of the mounting plate 126, act to offset the electronic devices 112 away from the mounting plate 126. Accordingly, the mounting feet 119 facilitate the creation of an air gap 160 defined between each electronic device 112 and the side of the mounting plate 126 to which the respective electronic devices 112 are mounted. Air is allowed to flow through the air gaps 160, which receive and transfer heat away from the electronic devices 112. Generally, the size (e.g., height or thickness) of each air gap 160 is based on (e.g., equal to) the size (e.g. height) of the mounting feet 119 of the corresponding electronic device 112. In some implementations, the size of the air gaps 160 on both sides of the mounting plate 126 of a given sled 110 are the same. However, in other implementations, the size of the air gaps 160 on both sides of the mounting plate 126 of a given sled 110 are different.

Figure 6:
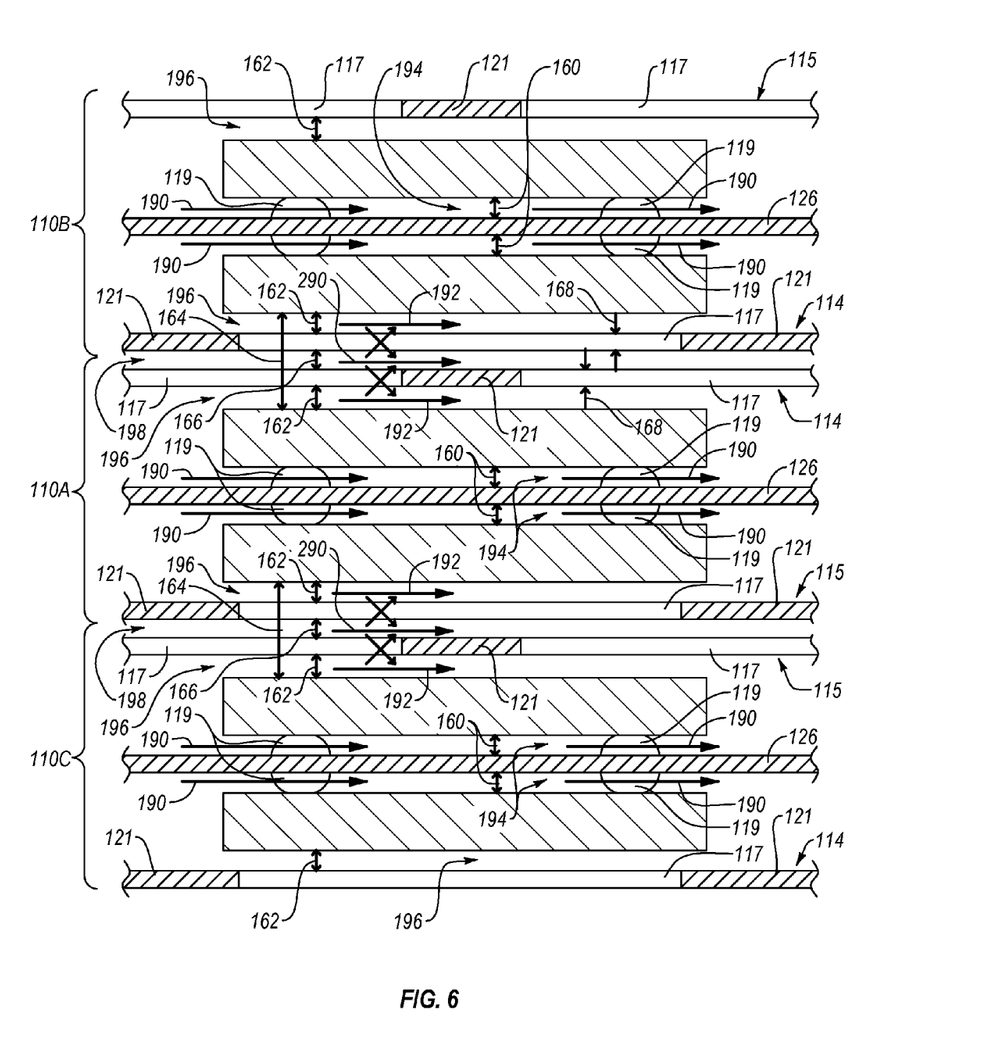
FIG. 6 is a cross-sectional front view of a portion of the plurality of stacked sleds of FIG. 4, taken along the line 6-6 of FIG. 4, according to one or more embodiments of the present disclosure.

Referring to FIG. 6, for each sled 110A-C, opposing unobstructed air flow channels 194, separated by the mounting plate 126 and each including collectively the air gaps 160 on a respective side of the mounting plate 126. Both unobstructed air flow channels 194 of each sled extend between and include the openings 150 of the end walls 123 of the base 124. In this manner, each opening 150 of the end walls 123 of the base 124 acts as a respective one of an inlet and outlet of the unobstructed air flow channels 194. As defined herein, an unobstructed air flow channel is a channel through which air may flow in a linear direction unimpeded by, or without encountering, being impacted, or being redirected by, an obstacle. Accordingly, as represented in FIG. 1A, air flowing in an air flow direction 190 within the air gaps 160 defining the air flow channels 194 flows from an inlet opening 150 to an outlet opening 150 without obstruction.

Each of the covers 114, 115 of the sled 110 is configured to at least partially cover a respective one of the openings 130 of the interior cavity 116 of the base 124. Generally, the covers 114, 115 at least partially restrict access to the interior cavity 116 through respective openings 130, when in a closed position (see, e.g., FIG. 1A) and allow unrestricted access to the interior cavity 116 through respective openings 130, when in an open position (see, e.g., FIG. 1B). In some implementations, the covers 114, 115 have a substantially flat or planar, thin-walled construction with a thickness 168. Additionally, each of the covers 114, 115 includes spaced-apart sides 146 that overlay a portion of the electronic devices 112 when in the closed position. Accordingly, when in the closed position, the spaced apart sides 146 of the covers 114, 115 not only protect the electronic devices 112, but also help to least partially retain the electronic devices 112 within the interior cavity 116, such as when the sled 110 is subject to excessive vibrations. Each of the covers 114, 115 also includes spaced-apart ends 148 extending transversely relative to the sides 146. As described in more detail below, the ends 148 are at least partially open to allow air flowing through air gaps 162 defined between each electronic device 112 and a respective one of the covers 114, 115 directly adjacent the electronic device 112. To help retain the covers 114, 115 to the open ends of the sidewalls 122 of the base 124, fixed flaps that engage and partially wrap about the sidewalls 122 can be coupled to and extend about the periphery of the covers 114, 115.

According to one embodiment, each of the covers 114, 115 is movably coupled to the base 124 and movable between the closed and open position. For example, the covers 114, 115 can be pivotally coupled to the base 124, such as via a hinge joint, to pivot between the closed and open position. According to another embodiment, the covers 114, 115 may be configured like a lid and be removably coupled to the sled 110 to position the covers in the closed position and removed from the sled to position the covers in the open position. When in the closed position, the ends 148 of each cover 114, 115 are substantially co-extensive (e.g., substantially co-planar) with the end walls 123 of the base 124. In other words, the covers 114, 115 can have the same length as the base 124.

The sled 110 stores any number of electronic devices 112. In FIG. 1B, the sled 110 can store up to eight electronic devices 112 on each side of the sled 110. The electronic devices 112 on each side of the sled 110 collectively define an array of electronic devices 112. According to the illustrated embodiment, the sled 110 has a generally rectangular shape, elongated in a lengthwise direction. Accordingly, the base 124, mounting plate 126, and the covers 114, 115 each has a generally rectangular shape. As shown in FIG. 2, each electronic device 112 can also have a generally rectangular, or square, shape with a length and width greater than a thickness. In other words, each electronic device 112 can have a substantially flat, box-like, shape. The electronic devices 112 are mounted to the mounting plate 126 in a side-by-side configuration, as opposed to a front-to-back configuration. In other words, the electronic devices 112 are mounted to the mounting plate 126 such that the length and width of the electronic devices 112 are parallel to the length and width of the sled 110. Put another way, when multiple sleds 110 are stacked vertically to create a stacked column 170 of sleds (see, e.g., FIG. 4), the electronic devices 112 on each side of the mounting plates 126 of the sleds 110 are arranged horizontally side-by-side.

Referring to FIG. 3, according to some embodiments, the sled 110 includes a printed circuit board 210 configured to facilitate electrical connectivity of the electronic devices 112 stored inside the sled 110 to electronic components (e.g., computers, servers, etc.) located outside the sled. The printed circuit board 210 is compliant to promote resilient flexibility of the printed circuit board 210 relative to the base 124. Although not shown, the printed circuit board 210 includes electrical circuits formed on or in the printed circuit board 210. The electrical circuits of the printed circuit board 210 facilitate the transmission of electrical power or signals therethrough. For example, the printed circuit board can include electrical leads, or an electrical interface, electrically coupled with electrical traces extending to an external electrical interface (also not shown) of the printed circuit board 210. Such an external electrical interface facilitates electrical interconnectivity between electronic devices external to the sled 110 and the printed circuit board 210.

The sled 110 further includes electrical connectors 316 each coupled to the printed circuit board 210. In the illustrated embodiment, an electrical connector 316 is non-movably fixed to the printed circuit board 210, and thus is co-movable with the printed circuit board 210 relative to the base 124. Additionally, an electrical connector 316 is electrically coupled with electrical leads or an interface of the printed circuit board 210 to facilitate the transmission of electrical signals or power between electronic devices external to the sled 110 and the electrical connectors 316 via the circuitry in the printed circuit board 210. In some implementations, an electrical connector 316 is electrically coupled with the printed circuit board 210 to facilitate the transmission of electrical signals or power between one or more electronic devices 112 stored in the sled 110.

Each electrical connector 316 is electrically coupleable with a respective one of the electronic devices 112 stored in the sled 110. Accordingly, each electrical connector 316 can be an electro-mechanical device for joining the electrical circuits of the electronic device 112 to the electrical circuits of the printed circuit board 210. The type and configuration of each electrical connector 316 will correspond to the type of electrical connector used by the electronic devices 112. For example, for a hard disk drive, the electrical connector 316 may be a SAS connector as depicted in the illustrated embodiments.

The sled 110 includes at least one locking mechanism 410 configured to act as a mechanical constraint for mechanically constraining movement of the printed circuit board 210, and thus the electrical connectors 316 coupled to the printed circuit board 210, relative to the sidewalls 122. The locking mechanism 410 is movably (e.g., slidably, rotatably, etc.) coupled to a sidewall 122 of the sled 110. In other words, the locking mechanism 410 is fixedly attached to the sidewall 122, but can move (e.g., slide) relative to the sidewall 122. Additionally, the locking mechanism 410 is movable relative to the printed circuit board 210. The locking mechanism 410 is positioned between the printed circuit board 210 and the sidewall 122, such that the locking mechanism 410 is movable between the printed circuit board 210 and the sidewall 122.

Each locking mechanism 410 includes at least one locking feature 412. Generally, when a locking mechanism 410 is in the locked position, the locking feature 412 releasably engages the printed circuit board 210 to constrain or restrict movement, in one or more degrees of freedom, of the printed circuit board 210 relative to the sidewalls 122 of the sled 110. In one embodiment, the locking feature 412 of a given locking mechanism 410 releasably engages a tab (not shown) of the printed circuit board 210 to constrain or restrict movement of the printed circuit board 210. More specifically, each locking feature 412 can be configured as a hook that releasably receives a tab of the printed circuit board 210 in the hook to constrain movement of the tab and thus the printed circuit board 210. The locking feature 412 can effectively wrap around three sides of a tab of the printed circuit board 210 to constrain or restrict movement of the printed circuit board 210 in at least three directions. Although the locking feature 412 is depicted as a hook, the locking feature 412 can have other configurations, or use other techniques, to releasably constrain movement of the printed circuit board 210 and thus the electrical connectors 316.

When a locking mechanism 410 is in the unlocked position, the locking feature 412 is not engaged with (e.g., is moved away from) the printed circuit board 210 and thus does not constrain or restrict movement of the printed circuit board 210 and thus the electrical connectors 316. For example, movement of the locking mechanism 410 from the locked position to the unlocked position releases the printed circuit board 210 from engagement with the locking feature 412. Although the illustrated embodiment depicts the locking mechanism 410 as being directly lockable to the printed circuit board 210, the locking mechanism 410 may alternatively, or additionally, be lockable directly to the electrical connectors 316, the printed circuit board 210, or even cables that connect the electrical devices 112 to components external to the sled 110.

According to some implementations, a locking mechanism 410 includes a push tab 118. The push tab 118 is configured to be engageable with one of the respective covers 114, 115 when the covers 114, 115 are in the closed positions (see, e.g., FIG. 3). The push tab 118 of each locking mechanism 410 extends through an opening in the sidewall 122 to be accessible to one of the covers 114, 115 for engagement. When the cover 114, 115 is moved into the closed position, the cover 114, 115 engages the push tabs 118 and moves the push tabs 118 and the associated locking mechanism 410 into the unlocked position. In other words, the cover 114, 115 displaces the push tabs 118 from the cover reception space 132, which concurrently moves the locking mechanism 410 into the unlocked position to disengage the locking feature 412 from the printed circuit board 210. Although the illustrated embodiments depict a push tab 118, the locking mechanisms 410 can be moved into the unlocked position by the cover 114, 115 using other configurations and techniques. According to some implementations, the sled 110 includes at least one biasing element configured to bias the locking mechanisms 410 into the locked position. Referring to FIG. 3, in one embodiment, each biasing element can be a spring 322. When the cover 114, 115 is in the closed position, engagement between the cover 114, 115 and the tabs 118 of the locking mechanism 410 moves the locking mechanism 410 into the unlocked position and pulls the springs 322 into tension (see, e.g., FIG. 3). The springs 322, when in tension, act to bias or urge the locking mechanism 410 toward the locked position. Once the cover 114, 115 is moved into the open position, the cover no longer prevents movement of the locking mechanism 410 into the locked position, and the induced bias of the springs 322 urges the locking mechanism 410 into the locked position.

Although depicted as tensionable coil springs, the biasing elements may utilize other configurations and techniques to mechanically bias the locking mechanism 410 to either the locked position or the unlocked position. In some embodiments, the biasing elements may be magnets. For example, the magnets may be placed above or below the locking mechanism 410 and configured to respectively attract or repel the locking mechanism 410 into the locked position. Other embodiments may utilize other mechanical and/or magnetic features to bias the locking mechanism 410 into the locked position without departing from the essence of the present disclosure.

Although the illustrated embodiments depict the locking mechanism 410 moving in response to the opening and closing of the cover 114, 115, in some embodiments the locking mechanism 410 is activated by a manual release or other mechanism or by using other configurations and techniques. For example, in one embodiment, the locking mechanism 410 is activated via engagement with a pin external to the sled 110. More specifically, the sled 110 can be insertable into and removable from a rack or enclosure (such as a server rack, server box, or other type of receptacle or repository) that includes a pin or analogous engagement element. With the sled 110 not fully inserted into the rack, the locking mechanism 410 is mechanically biased by a biasing element (e.g., a spring) into a locked position. With the sled 110 fully inserted into the rack, the pin engages the locking mechanism 410 to overcome the bias of the spring (e.g., compress the spring) and move the locking mechanism 410 into an unlocked position. In the unlocked position, the locking feature 412 no longer engages the printed circuit board 210. The spring remains compressed, and the locking mechanism 410 stays in the unlocked position until the sled 110 is removed from the rack, which disengages the pin from the locking mechanism 410 and allows the bias of the spring to move the locking mechanism 410 back into the locked position. The pin can engage the locking mechanism 410 through an opening in the sled 110. Alternatively, the locking mechanism 410 may include a portion that extends outside of the base 124 of the sled 110 allowing the pin or another engagement element of the rack to engage the locking mechanism at a point outside the sled 110.

Each of the covers 114, 115 includes at least two openings 117 spaced apart by respective slats 121. Each opening 117 is defined between opposing portions of the sides 146 of a cover and at least one slat 121. Additionally, two of the openings 117 of each cover 114, 115 are further defined between an open portion of a respective one of the ends 148 of the corresponding cover. In some implementations in which each cover 114, 115 has more than two openings 117, such as illustrated, at least one of the openings 117 is defined between two slats 121 and interposed between two openings 117. Each cover 114, 115 can have any number of openings 117 greater than two. For example, in the illustrated embodiment, each cover 114, 115 has five openings 117. The openings 117 can have any of various shapes and sizes. In the illustrated embodiment, the openings 117 are generally square or rectangular with a width defined between the sides 146 of the cover and a length defined either between a slat 121 and an end 148 of the cover, or defined between two slats 121 depending on the location of the opening 117 on the cover. For example, each of the openings 117 can have a first dimension in a first direction (e.g., lengthwise) greater than the first dimension of an electronic device 112 in the first direction and has a second dimension in a second direction (e.g., widthwise), perpendicular to the first direction, less than the second dimension of the electronic device 112 in the second direction. In some embodiments, the openings 117 are triangular, circular, or another shape other than rectangular or square.

According to certain implementations, the slats 121 extend substantially transversely between the sides 146 of the covers 114, 115 such that the length of an opening 117 is longer than a width of a slat 121, with a length of a slat 121 being equal to the width of the openings 117. Moreover, in some embodiments, the slats 121 extend between the sides 146 of the covers 114, 115 at angles other than 90-degrees relative to the sides 146.

Similar to the sides 146 of the covers 114, 115, when in the closed position, the slats 121 are configured to not only protect the electronic devices 112, but also help to least partially retain the electronic devices 112 within the interior cavity 116, such as when the sled 110 is subject to excessive vibrations. Accordingly, the number of openings 117, and thus the number of slats 121, is dependent on the number of electronic devices 112 stored on each side of a sled 110 in some embodiments. For example, in some implementations, the number and size of the openings 117 is selected such that each electronic device 112 stored in the sled 110 is overlaid by at least one slat 121. In one implementation, for a given sled 110, a ratio of a total number of openings 117 in a cover to a total number of data storage devices 112 removably fixed to the corresponding side of the mounting plate 126 is between about 0.5 and 0.75. According to a specific implementation, the ratio of a total number of openings 117 in a cover to a total number of data storage devices 112 removably fixed to the corresponding side of the mounting plate 126 is less than or equal to about 0.625.

The openings 117 are sized to achieve a desired open area percentage of the covers 114, 115. Generally, according to some embodiments, the desired open area percentage is the maximum open area percentage allowed while still providing sufficient strength and rigidity of the covers, as well as providing sufficient protection and/or retention of the electronic devices 112 by the sides 146 and slats 121 of the covers. According to certain implementations, the openings 117 are sized such that the open area percentage of each of the covers 114, 115 is greater than about 70%. In yet some implementations, the openings 117 are sized such that the open area percentage of each of the covers 114, 115 is greater than about 85%. As will be explained in more detail below, the higher the open area percentage of the covers 114, 115, the more air flow space between adjacent sleds 110 is shared by the adjacent sleds 110 for dissipating heat from the electronic devices 112 stored in the sleds 110.

Referring to FIG. 6, according to one embodiment, the slats 121 of the cover 114 of a sled 110A-C are staggered relative to the slats 121 of the cover 115 of the same sled 110. For example, referring to the sled 110A, in the air flow direction 190, although offset in a direction perpendicular to the air flow direction 190, the slat 121 of the cover 114 is positioned intermediate or between the slats 121 of the cover 115. In other words, when the covers 114, 115 are in the closed position, the slats 121 of the cover 114 of the sled 110A are not in the same horizontal plane (e.g., parallel to the air flow direction 190 or in the same vertical plane (e.g., perpendicular to the air flow direction 190) as the slats 121 of the cover 115 of the sled 110A. Put another way, in the vertical plane, the slats 121 of the cover 114 of the sled 110A do not overlap the slats 121 of the cover 115 of the sled 110A. However, although, in the illustrated embodiment, the slats 121 of the cover 114 of a sled 110 are staggered relative to the slats 121 of the cover 115 of the same sled 110, in other embodiments, the slats 121 of the cover 114 of a sled 110 overlay, or are not staggered relative to, the slats 121 of the cover 115 of the same sled 110.

Still referring to FIG. 6, when the covers 114, 115 are in the closed position, the electronic devices 112 are mounted to the mounting plate 126 such that an air gap 162 is defined between each electronic device 112 and a respective one of the covers 114, 115 (e.g., between each electronic device 112 and the openings 117 and slats 121 of the covers 114, 115). Each air gap 162 includes portions constrained or enclosed by the slats 121 and portions open to the openings 117. For each sled 110A-B, opposing unobstructed air flow channels 196, each including collectively the air gaps 162, are defined by a respective one of the covers 114, 115. Both unobstructed air flow channels 196 of each sled extend between and include open portions of the ends 148 of the covers 114, 115. In this manner, each open portion of the ends 148 of the covers 114, 115 acts as a respective one of an inlet and outlet of the unobstructed air flow channels 196. Therefore, as represented in FIG. 1A, air flowing in an air flow direction 192 within the air gaps 162 defining the air flow channels 196 flows from an inlet open portion of an end 148 to an outlet open portion of an opposing end 148 without obstruction.

Figure 4:
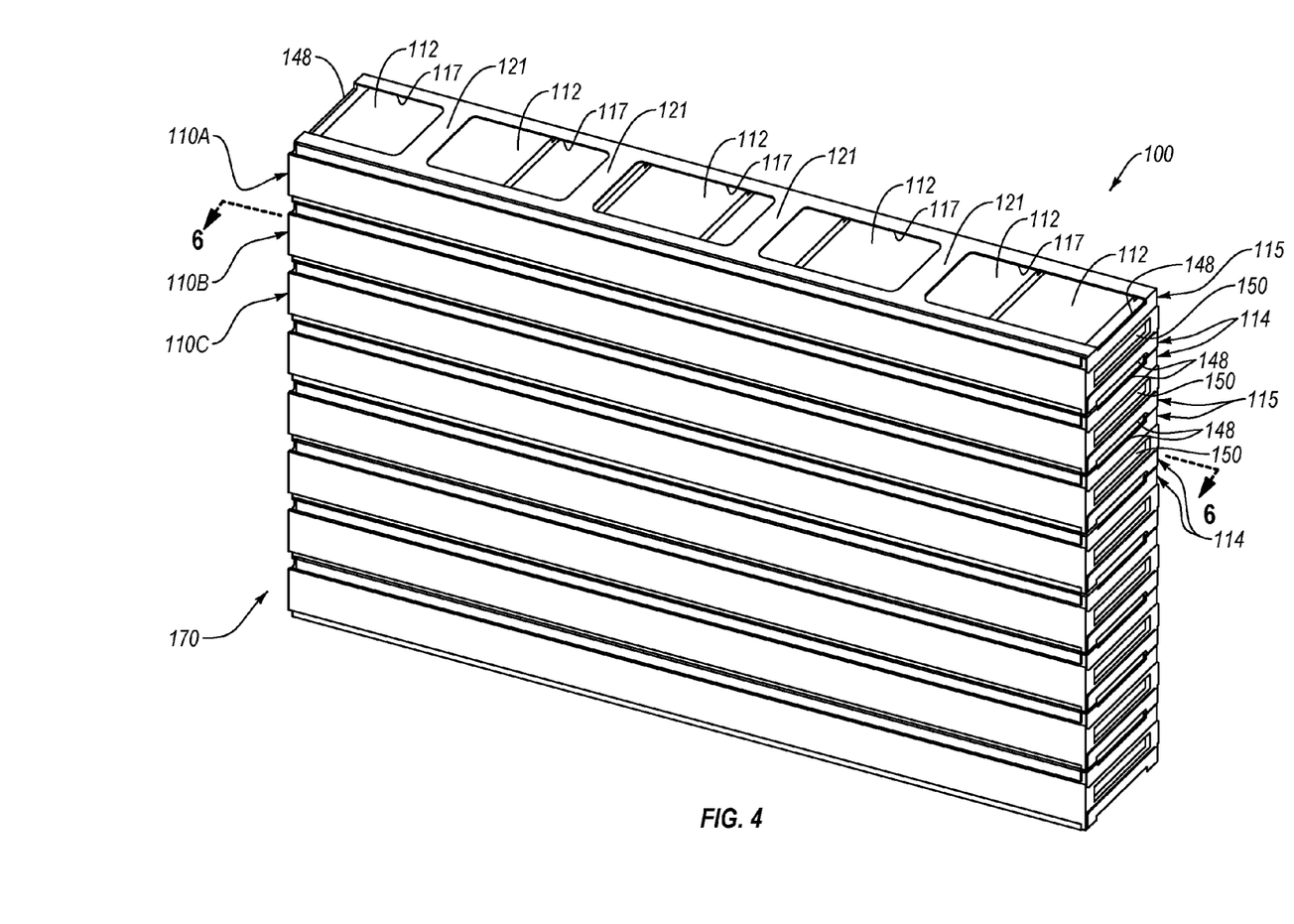
FIG. 4 is a perspective view of a plurality of stacked sleds each storing multiple electronic devices, according to one or more embodiments of the present disclosure.

Referring to FIG. 4, the system 100 includes a column 170 of vertically stacked sleds, each being configured according to the sled 110, as described above, with three adjacent sleds being referenced as sleds 110A-C. When vertically stacked, the electronic devices 112 of each sled 110 are horizontally aligned, and the sleds 110 are vertically aligned. As shown, in some embodiments, the sleds 110 of the column 170 have equal lengths and widths such that the length and width of the column 170 is constant along a height of the column 170. In other words, the sides of the sleds 110 of the column 170 are vertically aligned or co-planar, and the ends of the sleds 110 are vertically aligned or co-planar. The column 170 can be positioned within a larger enclosure or rack alone, or along with one or more additional columns 170. Additionally, in certain embodiments, the column 170 is fixedly secured to the larger enclosure or rack. For example, in one implementation, each sled 110 of the column 170 is individually or independently fixedly secured to the larger enclosure or rack.

Each sled 110 of the column 170 is positioned immediately adjacent at least one other sled 110 of the column 170. More specifically, uppermost and lowermost sleds 110 of the column 170 are immediately adjacent only one sled 110, while all other sleds 110 of the column 170 are immediately adjacent, or positioned immediately between, two sleds 110 of the column 170. As defined herein, and in reference to a vertically stacked column 170, each first cover 114 of a given sled 110 of the column 170 can be considered a top cover or a bottom cover depending on the orientation of the sled 110 in the column. Likewise, as defined herein, each second cover 115 of a given sled 110 of the column 170 can be considered a top cover or a bottom cover depending on the orientation of the sled in the column. In other words, the first cover 114 of a sled 110 is not necessarily a top cover, and the second cover 114 of a sled 110 is not necessarily a bottom cover. For example, in FIG. 4, the first cover 114 of the sled 110B is a top cover when vertically stacked in the column 170, and the first cover 114 of the sled 110A, above the sled 110B, is a bottom cover when vertically stacked in the column 170. Similarly, the second cover 115 of the sled 110B is a bottom cover when vertically stacked in the column 170, and the second cover 115 of the sled 110C, below the sled 110B, is a top cover when vertically stacked in the column 170. However, if the entire column 170 was flipped 180-degrees, the first cover 114 of the sled 110B would become a bottom cover, the first cover 114 of the sled 110A would become a top cover, the second cover 115 of the sled 110B would become a top cover, and the second cover 115 of the sled 110C would become a bottom cover. Although not shown, in some embodiments, the sleds of the column 170 can be horizontally stacked, or stacked in an orientation other than vertical or horizontal, as desired without departing from the essence of the present disclosure.

In such embodiments, each of the first and second covers 114, 115 of each sled is one of a left side cover or a right side cover, or one of a front cover or a rear cover.

When stacked together to form the column 170, the sleds 110 (or more specifically the covers of the sleds) are separated by an air gap 166 (see, e.g., FIG. 6). In some implementations, where the sleds 110 are individually fixedly secured to a larger enclosure or rack, or the sleds 110 are spaced apart via spacers, the air gap 166 is greater than zero. However, in certain implementations, the sleds 110 are stacked directly on top of and in contact with each other such that the gap 166 is zero.

As shown in FIG. 6, for implementations where the gap 166 between sleds 110 of the column 170 is greater than zero, each gap 166 may act as an air gap with portions constrained or enclosed by the slats 121 and portions open to the openings 117. In some implementations, an unobstructed air flow channel 198, defined by each gap 166, is positioned between adjacent sleds 110 of the column 170. Air may flow in an air flow direction 290 within the air flow channels 198 without obstruction.

Referring again to FIG. 6, when stacked together to form the column 170, an air gap 164 is defined between two directly adjacent electronic devices 112 of two adjacent sleds 110 of the column 170. For two adjacent sleds, such as sled 110A and sled 110B, the air gap 164 is defined as the gap defined by the collective and contiguous open spaces of an air gap 162 and an opening 117 of sled 110A, an air gap 162 and an opening 117 of the adjacent sled 110B, and the air gap 166 between the adjacent sleds 110A, 110B. Each air gap 164 provides a common or shared open space between the electronic devices 112 of adjacent sleds 110 of the column 170 that promotes intermixing or sharing of air flowing through air flow channels 196, 198 as indicated by the additional reference arrows in FIG. 6. The sharing of air between the electronic devices 112 improves air flow between the electronic devices 112 and the dissipation of heat from the electronic devices 112.

Figure 5:
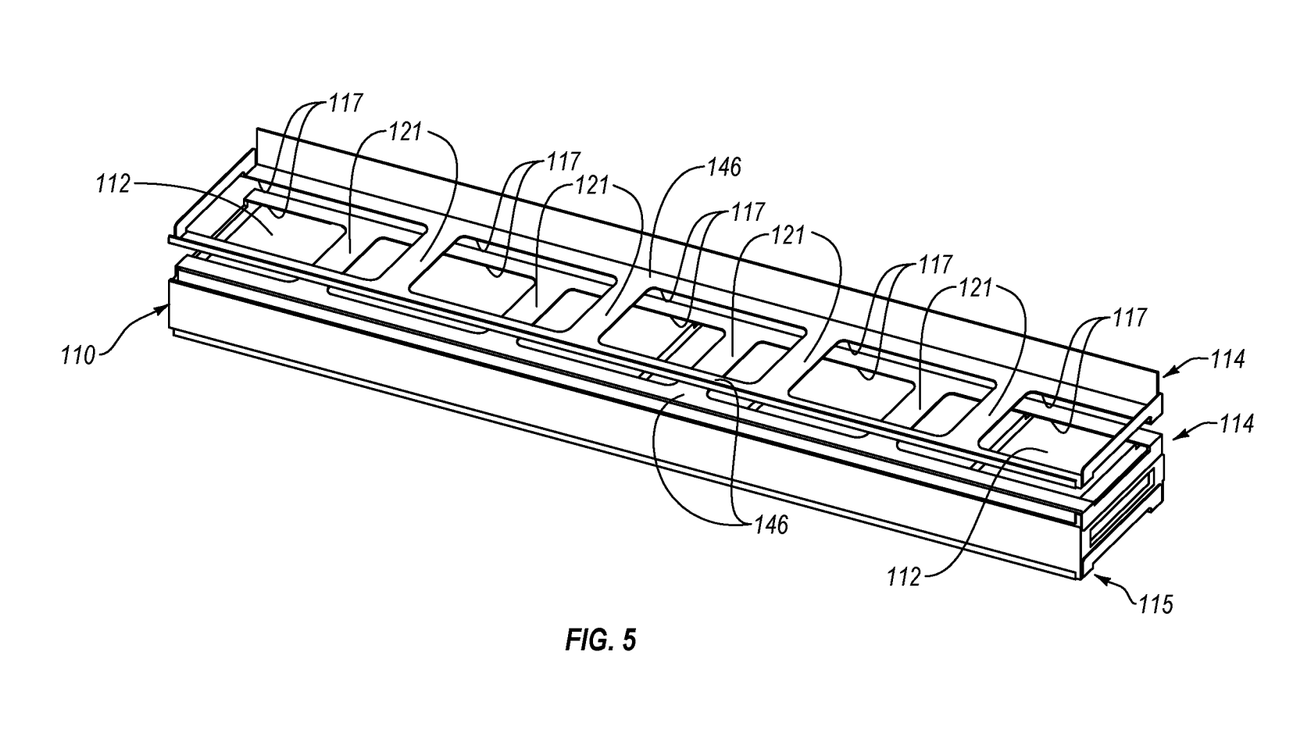
FIG. 5 is a perspective view of two stacked sleds, but showing only the adjacent cover of one of the sleds, according to one or more embodiments of the present disclosure.

Referring now to FIGS. 5 and 6, when the sleds 110 are stacked together to form the column 170, the slats 121 of the covers 114 of the sleds 110 directly adjacent each other are staggered (e.g., do not overlap each other in the same vertical plane), and the slats 121 of the covers 115 of the sleds 110 directly adjacent each other are staggered. Correspondingly, when the sleds 110 are stacked together to form the column 170, the openings 117 of the covers 114 of the sleds 110 directly adjacent each other at least partially overlap each other, in the same vertical plane, and the openings 117 of the covers 115 of the sleds 110 directly adjacent each at least partially overlap each other, in the same vertical plane. Because the slats 121 of adjacent sleds 110 do not overlap each other, which results in a thinner profile, obstruction to air flow through the gap 164 is reduced compared to overlapping slats where the thickness of the profile would be twice as high. Furthermore, the at least partial overlapping of the openings 117 facilitates the formation of the air gap 164 between electronic devices 112 of adjacent sleds 110. According to some implementations, a ratio of the total flow area of one air gap 160 of a sled 110 to the total flow area of the air gap 164 is less than about 1.2.

In the above description, certain terms may be used such as "up," "down," "upwards," "downwards," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two."

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The present subject matter may be embodied in other specific forms without departing from its spirit or essential characteristics. The described embodiments are to be considered in all respects only as illustrative and not restrictive. All changes which come within the meaning and range of equivalency of the claims are to be embraced within their scope.

What is claimed is:

1. A system, comprising:
   sleds, each comprising:
      sidewalls defining an interior space having a first open end;
      a mounting plate, comprising opposing first and second sides, non-movably fixed relative to the sidewalls and positioned within the interior space; and
      a first cover movable relative to the sidewalls between a closed position, at least partially covering the first open end, and an open position, uncovering the first open end, wherein the first cover comprises at least one first opening; and
   at least one data storage device removably fixed to the first side of each mounting plate of the sleds such that, for each sled, a first air gap is defined between the at least one data storage device and the first side of the mounting plate, and a second air gap is defined between the at least one data storage device and the at least one first opening of the first cover;
   wherein the sleds are stacked together such that the first covers of adjacent sleds are directly adjacent each other, and the at least one first opening of the first cover of one sled at least partially overlaps the at least one first opening of an adjacent sled.

2. The system of claim 1, wherein:
   the first cover comprises at least two first openings and a slat separating adjacent first openings of the at least two first openings; and
   the slats of the first covers of adjacent sleds do not overlap each other.

3. The system of claim 1, wherein:
   the first cover comprises a plurality of first openings;
   the first cover comprises a plurality of slats each separating adjacent first openings of the plurality of first openings of the first cover; and
   the sleds are stacked together such that the plurality of slats of the first cover of one sled are staggered relative to the plurality of slats of the first cover of an adjacent sled.

4. The system of claim 1, wherein:
   the interior space has a second open end, defined by the sidewalls, opposing and spaced apart from the first open end;
   the mounting plate is positioned between the first and second open ends of the interior space;
   each sled further comprises a second cover movable relative to the sidewalls between a closed position, at least partially covering the second open end, and an open position, uncovering the second open end, wherein the second cover comprises at least one second opening;
   at least one data storage device is removably fixed to the second side of each mounting plate of the sleds such that for each sled, a third air gap is defined between the at least one data storage device and the second side of the mounting plate, and a fourth air gap is defined between the at least one data storage device and the at least one second opening of the second cover; and
   the sleds are stacked together such that the second covers of adjacent sleds are directly adjacent each other, and the at least one second opening of the second cover of one sled at least partially overlaps the at least one second opening of an adjacent sled.

5. The system of claim 4, wherein:
the second cover comprises at least two second openings and a slat separating adjacent second openings of the at least two second openings; and
the slats of the second covers of adjacent sleds do not overlap each other.

6. The system of claim 1, wherein:
the sleds are vertically stacked;
a plurality of data storage devices are removably fixed to the first side of each mounting plate of the sleds; and
the plurality of data storage devices on the first side of each mounting plate are positioned horizontally adjacent each other.

7. The system of claim 6, wherein:
the first cover further comprises:
spaced-apart sides closed to and defining the at least one first opening; and
spaced-apart ends open to the at least one first opening; and
for each sled, a first unobstructed air flow channel, comprising the second air gaps, extends between the spaced-apart ends of the first cover, inclusively.

8. The system of claim 7, wherein:
the sidewalls comprise spaced-apart end walls substantially co-extensive with the spaced-apart ends of the first cover;
the end walls each comprise at least one third opening; and
for each sled, a second unobstructed air flow channel, comprising the first air gaps, extends between the third openings of the end walls, inclusively.

9. The system of claim 8, wherein:
the interior space has a second open end, defined by the sidewalls, opposing and spaced apart from the first open end;
the mounting plate is positioned between the first and second open ends of the interior space;
each sled further comprises a second cover movable relative to the sidewalls between a closed position, at least partially covering the second open end, and an open position, uncovering the second open end, wherein the second cover comprises at least one second opening, spaced-apart sides closed to and defining the at least one second opening, and spaced-apart ends open to the at least one second opening;
the spaced-apart end walls of the sidewalls are substantially co-extensive with the spaced-apart ends of the second cover;
at least one data storage device is removably fixed to the second side of each mounting plate of the sleds such that for each sled, a third air gap is defined between the at least one data storage device and the second side of the mounting plate, and a fourth air gap is defined between the at least one data storage device and the at least one second opening of the second cover;
the sleds are stacked together such that the second covers of adjacent sleds are directly adjacent each other, and each of the at least one second opening of the second cover of one sled at least partially overlaps the at least one second opening of an adjacent sled;
for each sled, a third unobstructed air flow channel, comprising the third air gaps, extends between the spaced-apart ends of the second cover, inclusively; and for each sled, a fourth unobstructed air flow channel, comprising the fourth air gaps, extends between the third openings of the end walls, inclusively.

10. The system of claim 1, wherein:
a third air gap is defined between the at least one data storage device of one sled and the at least one data storage device of an adjacent sled; and
a ratio of a thickness of the third air gap to the thickness of the first air gap is less than about 1.5.

11. The system of claim 1, wherein:
a third air gap is defined between the at least one data storage device of one sled and the at least one data storage device of an adjacent sled; and
a ratio of a total flow area of the first air gap to a total flow area of the third air gap is less than about 1.2.

12. The system of claim 1, wherein the at least one first opening is sized such that an open area percentage of the first cover is greater than about 70%.

13. The system of claim 12, wherein, for each sled, a ratio of a total number of first openings in the first cover to a total number of data storage devices removably fixed to the first side of the mounting plate is less than or equal to about 0.625.

14. The system of claim 1, wherein the at least one first opening has a first dimension in a first direction greater than the first dimension of each of the at least one data storage device in the first direction and has a second dimension in a second direction, perpendicular to the first direction, less than the second dimension of each of the at least one data storage device in the second direction.

15. A sled for storing a plurality of data storage devices, the sled comprising:
sidewalls defining an interior space having a first open end and a second open end opposing the first open end;
a mounting plate, comprising opposing first and second sides, non-movably fixed relative to the sidewalls and positioned within the interior space between the first and second open ends;
a first cover movable relative to the sidewalls between a closed position, at least partially covering the first open end, and an open position, uncovering the first open end, wherein the first cover comprises at least two first openings and a slat separating adjacent first openings of the at least two first openings; and
a second cover movable relative to the sidewalls between a closed position, at least partially covering the second open end, and an open position, uncovering the second open end, wherein the second cover comprises at least two second openings and a slat separating adjacent second openings of the at least two second openings;
wherein each slat of the first cover is staggered relative to each slat of the second cover.

16. The sled of claim 15, wherein the first cover and second cover are pivotally coupled to the sidewalls and pivotable relative to the sidewalls between the closed and open positions.

17. The sled of claim 15, wherein:
the first cover further comprises:
spaced-apart sides closed to and defining the at least two first openings; and
spaced-apart ends open to the at least two first openings; and
the second cover further comprises:
spaced-apart sides closed to and defining the at least two second openings; and
spaced-apart ends open to the at least two second openings.

18. The sled of claim 17, wherein:
the sidewalls comprise spaced-apart end walls substantially co-extensive with the spaced-apart ends of the first cover and the second cover; and
the end walls each comprises at least one second opening.

19. The sled of claim 15, wherein:
the at least two first openings are sized such that an open area percentage of the first cover is greater than about 70%; and
the at least two second openings are sized such that an open area percentage of the second cover is greater than about 70%.

20. A system, comprising:
sleds, each comprising:
sidewalls defining an interior space having a first open end and a second open end opposing and spaced apart from the first open end;
a mounting plate, comprising opposing first and second sides, non-movably fixed relative to the sidewalls and positioned within the interior space between the first and second open ends of the interior space;
a first cover movable relative to the sidewalls between a closed position, at least partially covering the first open end, and an open position, uncovering the first open end, wherein the first cover comprises at least two first openings and a slat separating adjacent first openings of the at least two first openings; and
a second cover movable relative to the sidewalls between a closed position, at least partially covering the second open end, and an open position, uncovering the second open end, wherein the second cover comprises at least two second openings and a slat separating adjacent second openings of the at least two second openings; and
a plurality of data storage devices removably fixed to each of the first side and second side of each mounting plate of the sleds such that, for each sled, a first air gap is defined between the at least one data storage device and the first side of the mounting plate, a second air gap is defined between the at least one data storage device and the at least two first openings of the first cover, a third air gap is defined between the at least one data storage device and the second side of the mounting plate, and a fourth air gap is defined between the at least one data storage device and the at least two second openings of the second cover;
wherein the sleds are stacked together such that the first covers of adjacent sleds are directly adjacent each other, each of the at least two first openings of the first cover of one sled at least partially overlaps the at least two first openings of an adjacent sled, the slats of the first covers of adjacent sleds do not overlap each other, the second covers of adjacent sleds are directly adjacent each other, each of the at least two second openings of the second cover of one sled at least partially overlaps the at least two second openings of an adjacent sled, and the slats of the second covers of adjacent sleds do not overlap each other.

* * * * *